United States Patent
Bao et al.

(10) Patent No.: US 12,094,404 B2
(45) Date of Patent: Sep. 17, 2024

(54) DISPLAY MODULE AND METHOD FOR DRIVING THE SAME, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Wenchao Bao, Beijing (CN); Song Meng, Beijing (CN); Min He, Beijing (CN); Huihui Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/701,615

(22) Filed: Mar. 22, 2022

(65) Prior Publication Data
US 2022/0284853 A1    Sep. 8, 2022

Related U.S. Application Data

(63) Continuation-in-part of application No. PCT/CN2020/136208, filed on Dec. 14, 2020.

(51) Int. Cl.
G09G 3/3225    (2016.01)
G02F 1/1345    (2006.01)
(Continued)

(52) U.S. Cl.
CPC .......... *G09G 3/3225* (2013.01); *G09G 3/006* (2013.01); *H05K 1/189* (2013.01); *H10K 50/868* (2023.02);
(Continued)

(58) Field of Classification Search
CPC ............... G09G 3/3225; G09G 3/006; G09G 2330/021; H01L 51/5293; H05K 1/189; H05K 2201/10128
See application file for complete search history.

(56) References Cited

U.S. PATENT DOCUMENTS

2003/0001813 A1\* 1/2003 Sekiguchi ............ G09G 3/3629
345/96
2006/0109394 A1\* 5/2006 Miyagawa ............. H05K 3/361
349/149
(Continued)

FOREIGN PATENT DOCUMENTS

CN    101383501 A   \*  3/2009  ............ H02H 7/085
CN    105511546 A   \*  4/2016  ............ G09G 3/006
(Continued)

OTHER PUBLICATIONS

International Search Report and Written Opinion of the International Searching Authority for Application No. PCT/CN2020/136208 issued by the Patent Cooperation Treaty on Sep. 13, 2021.

*Primary Examiner* — Lin Li
(74) *Attorney, Agent, or Firm* — IP & T GROUP LLP

(57) ABSTRACT

A display module includes a display panel, a power supply driver, a voltage signal line, a sampling resistor and a detection and control circuit. The voltage signal line is connected between the display panel and the power supply driver. The sampling resistor is connected in series with the voltage signal line. The detection and control circuit is connected to two ends of the sampling resistor and the power supply driver. The detection and control circuit is configured to: detect a voltage across the sampling resistor or a current flowing through the sampling resistor; and control the power supply driver to generate a driving voltage equal to a preset value lower than a voltage threshold, if determining that the voltage across the sampling resistor is greater than or equal to the voltage threshold, or if determining that the current is greater than or equal to a current threshold.

5 Claims, 13 Drawing Sheets

(51) Int. Cl.
*G09G 3/00* (2006.01)
*G09G 3/34* (2006.01)
*G09G 3/36* (2006.01)
*H01L 51/52* (2006.01)
*H02M 1/32* (2007.01)
*H05B 45/60* (2022.01)
*H05K 1/18* (2006.01)
*H10K 50/80* (2023.01)

(52) U.S. Cl.
CPC ................. *G09G 2330/021* (2013.01); *H05K 2201/10128* (2013.01)

(56) References Cited

U.S. PATENT DOCUMENTS

| | | | |
|---|---|---|---|
| 2011/0043505 A1* | 2/2011 | Ahn | H05B 45/60 345/211 |
| 2016/0365058 A1* | 12/2016 | Nam | G09G 3/3696 |
| 2017/0229076 A1* | 8/2017 | Zhou | G02F 1/1345 |
| 2018/0061294 A1* | 3/2018 | Kim | G09G 3/367 |
| 2020/0382740 A1* | 12/2020 | Zhou | G09G 3/3406 |
| 2021/0343202 A1 | 11/2021 | Huang | |
| 2021/0404983 A1 | 12/2021 | Guo | |

FOREIGN PATENT DOCUMENTS

| | | | | |
|---|---|---|---|---|
| CN | 106228938 A | | 12/2016 | |
| CN | 106847143 A | * | 6/2017 | ............ G09G 3/00 |
| CN | 106920514 A | | 7/2017 | |
| CN | 107481678 A | | 12/2017 | |
| CN | 206992946 U | * | 2/2018 | ............ H02M 1/32 |
| CN | 109166502 A | | 1/2019 | |
| CN | 109637461 A | * | 4/2019 | ............ G09G 3/34 |
| CN | 110264926 A | | 9/2019 | |
| CN | 106847143 B | * | 12/2020 | ............ G09G 3/00 |
| CN | 112710893 B | * | 8/2023 | ............ G01R 19/25 |
| JP | 201032789 A | | 2/2010 | |

* cited by examiner

300

100 (200)

```
┌─────────────────────────────────────────────────────┐
│ An analog-to-digital converter obtains potentials   │   S400
│ at the two ends of the sampling resistor, converts  │
│ the potentials at the two ends of the sampling      │
│ resistor from analog potential signals to digital   │
│ potential signals, and then outputs the digital     │
│ potential signals to a logic controller             │
└─────────────────────────────────────────────────────┘
                           │
                           ▼
┌─────────────────────────────────────────────────────┐
│ The logic controller obtains the potentials at the  │   S401
│ two ends of the sampling resistor, and calculates a │
│ difference between the potentials at the two ends   │
│ of the sampling resistor according to the           │
│ potentials at the two ends of the sampling          │
│ resistor, and the difference is a voltage across    │
│ the sampling resistor                               │
└─────────────────────────────────────────────────────┘
                           │
                           ▼
┌─────────────────────────────────────────────────────┐
│ The logic controller compares the voltage across    │
│ the sampling resistor with the voltage threshold    │
│ to obtain a comparison result, and if the           │
│ comparison result is that the voltage is greater    │
│ than or equal to the voltage threshold, controls    │
│ the power supply driver to generate the driving     │   S402
│ voltage equal to the preset value lower than the    │
│ voltage threshold; or, the logic controller obtains │
│ a resistance of the sampling resistor, calculates   │
│ the current flowing through the sampling resistor   │
│ according to the resistance of the sampling         │
│ resistor and the voltage across the sampling        │
│ resistor, and compares the current flowing through  │
│ the sampling resistor with a current threshold to   │
│ obtain another comparison result; and if the        │
│ comparison result is that the current is greater    │
│ than or equal to the current threshold, controls    │
│ the power supply driver to generate the driving     │
│ voltage equal to the preset value lower than the    │
│ voltage threshold                                   │
└─────────────────────────────────────────────────────┘
```

FIG. 18

```
┌─────────────────────────────────────────────────────┐
│ A detection and output circuit detects and outputs  │   S501
│ the voltage across the sampling resistor or the     │
│ current flowing through the sampling resistor       │
└─────────────────────────────────────────────────────┘
```

FIG. 19

DISPLAY MODULE AND METHOD FOR DRIVING THE SAME, AND DISPLAY APPARATUS

CROSS-REFERENCE TO RELATED APPLICATIONS

This application is a Bypass Continuation-in-Part Application of PCT/CN2020/136208 filed on Dec. 14, 2020, titled "DISPLAY MODULE AND METHOD FOR CONTROLLING THE SAME, AND DISPLAY APPARATUS", which is incorporated herein by reference in its entirety.

TECHNICAL FIELD

The present disclosure relates to the field of display technologies, and in particular, to a display module and a method for driving the same, and a display apparatus.

BACKGROUND

An active-matrix organic light-emitting diode (AMOLED) display screen is a current-driven display screen, which has the advantages of low driving voltage, long service life of light-emitting elements, low power consumption, fast response speed, and not being prone to electric leakage, etc. Therefore, the AMOLED display screen is usually applied to a large-size organic light-emitting diode (OLED) panel product.

SUMMARY

In an aspect, a display module is provided. The display module includes a display panel, a power supply driver, a voltage signal line, a sampling resistor, and a detection and control circuit. The power supply driver is configured to generate a driving voltage. The voltage signal line is connected between the display panel and the power supply driver. The voltage signal line is configured to transmit the driving voltage generated by the power supply driver to the display panel, so that the display panel emits light. The sampling resistor is connected in series with the voltage signal line. The detection and control circuit is connected to two ends of the sampling resistor. The detection and control circuit is configured to detect a voltage across the sampling resistor or a current flowing through the sampling resistor. The detection and control circuit is further connected to the power supply driver. The detection and control circuit is further configured to perform any one of controlling the power supply driver to generate a driving voltage equal to a preset value lower than a voltage threshold if the detection and control circuit determines that the voltage across the sampling resistor is greater than or equal to the voltage threshold, and controlling the power supply driver to generate the driving voltage equal to the preset value lower than the voltage threshold if the detection and control circuit determines that the current is greater than or equal to a current threshold.

In some embodiments, the display module further includes a chip-on-film circuit board. The chip-on-film circuit board includes a substrate, a first connection electrode and a second connection electrode that are located on the substrate. The first connection electrode is connected to the display panel. The voltage signal line includes a first conductive portion located on the substrate and connected between the first connection electrode and the second connection electrode, and a second conductive portion connected between the second connection electrode and the power supply driver. The sampling resistor is connected with the second conductive portion.

In some embodiments, the display module further includes a main control circuit board. The main control circuit board is connected to the second connection electrode. The second conductive portion, the sampling resistor, the power supply driver and the detection and control circuit are all located on the main control circuit board. Alternatively, the display module further includes the main control circuit board and a flexible circuit board. The flexible circuit board is connected between the main control circuit board and the second connection electrode. The second conductive portion and the sampling resistor are located on the flexible circuit board. The power supply driver and the detection and control circuit are located on the main control circuit board.

In some embodiments, the detection and control circuit includes a subtractor circuit, a comparator circuit and a logic controller. The subtractor circuit is connected to the two ends of the sampling resistor. The subtractor circuit is configured to obtain potentials at the two ends of the sampling resistor, and calculate a difference between the potentials at the two ends of the sampling resistor according to the potentials at the two ends of the sampling resistor. The difference is the voltage across the sampling resistor. The comparator circuit is connected to the subtractor circuit. The comparator circuit is configured to obtain the voltage across the sampling resistor calculated by the subtractor circuit, and compare the voltage across the sampling resistor with the voltage threshold to obtain a comparison result. The logic controller is connected to the comparator circuit and the power supply driver. The logic controller is configured to obtain the comparison result of the comparator circuit, and control the power supply driver to generate the driving voltage equal to the preset value lower than the voltage threshold if the comparison result is that the voltage across the sampling resistor is greater than or equal to the voltage threshold.

In some embodiments, the detection and control circuit includes a subtractor circuit and a logic controller. The subtractor circuit is connected to the two ends of the sampling resistor. The subtractor circuit is configured to obtain potentials at the two ends of the sampling resistor, and calculate a difference between the potentials at the two ends of the sampling resistor according to the potentials at the two ends of the sampling resistor. The difference is the voltage across the sampling resistor. The logic controller is connected to the subtractor circuit and the power supply driver. The logic controller is configured to obtain the voltage across the sampling resistor calculated by the subtractor circuit, and compare the voltage across the sampling resistor with the voltage threshold to obtain a comparison result, and control the power supply driver to generate the driving voltage equal to the preset value lower than the voltage threshold if the comparison result is that the voltage across the sampling resistor is greater than or equal to the voltage threshold. Alternatively, the logic controller is configured to obtain a resistance of the sampling resistor and the voltage across the sampling resistor calculated by the subtractor circuit; calculate the current flowing through the sampling resistor according to the resistance of the sampling resistor and the voltage across the sampling resistor, and compare the current flowing through the sampling resistor with the current threshold to obtain a comparison result; and control the power supply driver to generate the driving voltage equal to the preset value lower than the voltage threshold if the comparison result is that the current is greater than or equal to the current threshold.

In some embodiments, the detection and control circuit includes a logic controller, and the logic controller is connected to the two ends of the sampling resistor. The logic controller is configured to obtain potentials at the two ends of the sampling resistor, and calculate a difference between the potentials at the two ends of the sampling resistor according to the potentials at the two ends of the sampling resistor. The difference is the voltage across the sampling resistor. The logic controller is further configured to compare the voltage across the sampling resistor with the voltage threshold to obtain a comparison result, and control the power supply driver to generate a driving voltage equal to the preset value lower than the voltage threshold if the comparison result is that the voltage across the sampling resistor is greater than or equal to the voltage threshold. Alternatively, the logic controller is further configured to: obtain a resistance of the sampling resistor; calculate the current flowing through the sampling resistor according to the resistance of the sampling resistor and the voltage across the sampling resistor; compare the current flowing through the sampling resistor with the current threshold to obtain a comparison result; and control the power supply driver to generate the driving voltage equal to the preset value lower than the voltage threshold if the comparison result is that the current is greater than or equal to the current threshold.

In some embodiments, the display module further includes an analog-to-digital converter. The analog-to-digital converter is connected between the logic controller and the sampling resistor. The analog-to-digital converter is configured to obtain the potentials at the two ends of the sampling resistor, and convert the potentials at the two ends of the sampling resistor from analog potential signals to digital potential signals, and then output the digital potential signals to the logic controller.

In some embodiments, the preset value is equal to 0 V.

In some embodiments, the display module further includes a polarizer disposed on a display side of the display panel.

In another aspect, another display module is provided. The display module includes a display panel, a power supply driver, a voltage signal line, a sampling resistor, and a detection and output circuit. The power supply driver is configured to generate a driving voltage. The voltage signal line is connected between the display panel and the power supply driver. The voltage signal line is configured to transmit the driving voltage generated by the power supply driver to the display panel, so that the display panel emits light. The sampling resistor is connected in series with the voltage signal line. The detection and output circuit is connected to two ends of the sampling resistor. The detection and output circuit is configured to detect and output a voltage across the sampling resistor or a current flowing through the sampling resistor.

In some embodiments, the detection and output circuit includes a subtractor circuit and an analog-to-digital converter. The subtractor circuit is connected to the two ends of the sampling resistor. The subtractor circuit is configured to obtain potentials at the two ends of the sampling resistor, and calculate a difference between the potentials at the two ends of the sampling resistor according to the potentials at the two ends of the sampling resistor. The difference is the voltage across the sampling resistor. The analog-to-digital converter is connected to the subtractor circuit. The analog-to-digital converter is configured to convert the calculated voltage across the sampling resistor from an analog voltage signal to a digital voltage signal, and output the digital voltage signal.

In yet another aspect, a display apparatus is provided, which includes the display module as described in any of the above embodiments.

In yet another aspect, a method for driving a display module is provided. The display module includes a display panel, a power supply driver, a voltage signal line, a sampling resistor and a detection and control circuit. The voltage signal line is connected between the display panel and the power supply driver, and the sampling resistor is connected in series with the voltage signal line. The detection and control circuit is connected to two ends of the sampling resistor, and the detection and control circuit is to further connected to the power supply driver. The method includes: detecting, by the detection and control circuit, a voltage across the sampling resistor or a current flowing through the sampling resistor; and performing, by the detection and control circuit, any one of controlling the power supply driver to generate a driving voltage equal to a preset value lower than a voltage threshold if the detection and control circuit determines that the voltage across the sampling resistor is greater than or equal to the voltage threshold, and controlling the power supply driver to generate the driving voltage equal to the preset value lower than the voltage threshold if the detection and control circuit determines that the current is greater than or equal to a current threshold.

In some embodiments, the detection and control circuit includes a subtractor circuit, a comparator circuit and a logic controller. The subtractor circuit is connected to the two ends of the sampling resistor. The comparator circuit is connected to the subtractor circuit. The logic controller is connected to the comparator circuit, and the logic controller is further connected to the power supply driver. The method includes: obtaining, by the subtractor circuit, potentials at the two ends of the sampling resistor; calculating, by the subtractor circuit, a difference between the potentials at the two ends of the sampling resistor according to the potentials at the two ends of the sampling resistor, the difference being the voltage across the sampling resistor; obtaining, by the comparator circuit, the voltage across the sampling resistor calculated by the subtractor circuit; comparing, by the comparator circuit, the voltage across the sampling resistor with the voltage threshold to obtain a comparison result; and obtaining, by the logic controller, the comparison result of the comparator circuit; and controlling, by the logic controller, the power supply driver to generate the driving voltage equal to the preset value lower than the voltage threshold if the comparison result is that the voltage across the sampling resistor is greater than or equal to the voltage threshold.

In some embodiments, the detection and control circuit includes a subtractor circuit and a logic controller. The subtractor circuit is connected to the two ends of the sampling resistor. The logic controller is connected to the subtractor circuit, and the logic controller is further connected to the power supply driver. The method includes: obtaining, by the subtractor circuit, potentials at the two ends of the sampling resistor; calculating, by the subtractor circuit, a difference between the potentials at the two ends of the sampling resistor according to the potentials at the two ends of the sampling resistor, the difference being the voltage across the sampling resistor; and obtaining, by the logic controller, the voltage across the sampling resistor calculated by the subtractor circuit; comparing, by the logic controller, the voltage across the sampling resistor with the voltage threshold to obtain the comparison result; and controlling the power supply driver to generate the driving voltage equal to the preset value lower than the voltage threshold if the comparison result is that the voltage across the sampling resistor is greater than or equal to the voltage threshold; or obtaining, by the logic controller, a resistance of the sampling resistor and the voltage across the sampling resistor calculated by the subtractor circuit; calculating, by the logic controller, the current flowing through the sampling resistor according to the resistance of the sampling resistor and the voltage across the sampling resistor; comparing, by the logic controller, the current flowing through the sampling resistor with the current threshold to obtain the comparison result, and controlling, by the logic controller, the power supply driver to generate the driving voltage equal to the preset value lower than the voltage threshold if the comparison result is that the current is greater than or equal to the current threshold.

In some embodiments, the detection and control circuit includes a logic controller. The logic controller is connected to the two ends of the sampling resistor, and the logic controller is also connected to the power supply driver. The method includes: obtaining, by the logic controller, potentials at the two ends of the sampling resistor; calculating, by the logic controller, the difference between the potentials at the two ends of the sampling resistor according to the potentials at the two ends of the sampling resistor, the difference being the voltage across the sampling resistor; and comparing, by the logic controller, the voltage across the sampling resistor with the voltage threshold to obtain a comparison result; and controlling, by the logic controller, the power supply driver to generate the driving voltage equal to the preset value lower than the voltage threshold if the comparison result is that the voltage across the sampling resistor is greater than or equal to the voltage threshold; or obtaining, by the logic controller, a resistance of the sampling resistor; calculating, by the logic controller, the current flowing through the sampling resistor according to the resistance of the sampling resistor and the voltage across the sampling resistor; comparing, by the logic controller, the current flowing through the sampling resistor with the current threshold to obtain a comparison result; and controlling, by the logic controller, the power supply driver to generate the driving voltage equal to the preset value lower than the voltage threshold if the comparison result is that the current is greater than or equal to the current threshold.

In some embodiments, the display module further includes an analog-to-digital converter. The analog-to-digital converter is connected between the logic controller and the sampling resistor. Before the logic controller obtains the potentials at the two ends of the sampling resistor, the method further includes: obtaining, by the analog-to-digital converter, the potentials at the two ends of the sampling resistor; converting, by the analog-to-digital converter, the potentials at the two ends of the sampling resistor from analog potential signals to digital potential signals; and outputting, by the analog-to-digital converter, the digital potential signals to the logic controller.

In yet another aspect, a method for driving a display module is provided. The display module includes a display panel, a power supply driver, a voltage signal line, a sampling resistor, and a detection and output circuit. The voltage signal line is connected between the display panel and the power supply driver, the sampling resistor is connected in series with the voltage signal line, and the detection and output circuit is connected to two ends of the sampling resistor. The method includes: detecting and outputting, by the detection and output circuit, the voltage across the sampling resistor or the current flowing through the sampling resistor.

In some embodiments, the detection and output circuit includes a subtractor circuit and an analog-to-digital converter. The subtractor circuit is connected to the two ends of the sampling resistor, and the analog-to-digital converter is connected to the subtractor circuit. The method includes: obtaining, by the subtractor circuit, potentials at the two ends of the sampling resistor; calculating, by the subtractor circuit, a difference between the potentials at the two ends of the sampling resistor according to the potentials at the two ends of the sampling resistor, the difference being the voltage across the sampling resistor; converting, by the analog-to-digital converter, the voltage across the sampling resistor calculated by the subtractor circuit from an analog voltage signal to a digital voltage signal, and outputting, by the analog-to-digital converter, the digital voltage signal.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

FIG. 18 is a flow diagram of yet another method for driving a display module, in accordance with some embodiments;

FIG. 19 is a flow diagram of yet another method for driving a display module, in accordance with some embodiments;

DETAILED DESCRIPTION

Figure 1:
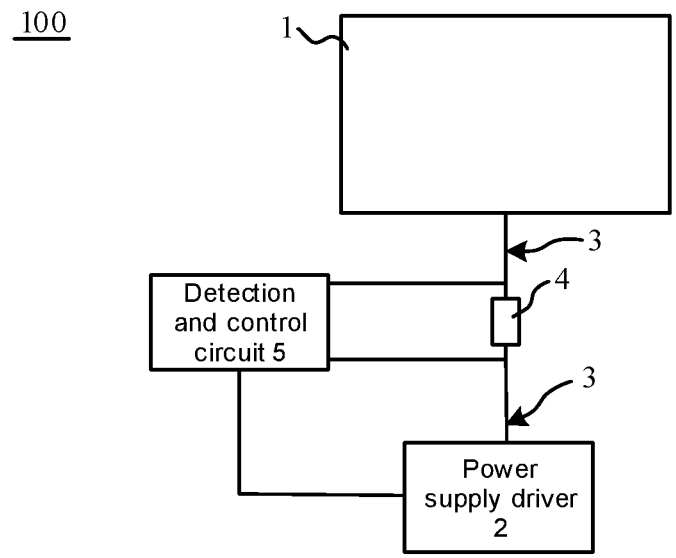
FIG. 1 is a structural diagram of a display module, in accordance with some embodiments.

Technical solutions in some embodiments of the present disclosure will be described clearly and completely below with reference to the accompanying drawings. However, the described embodiments are merely some but not all of embodiments of the present disclosure. All other embodiments obtained based on the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", and "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein indicates an open and inclusive expression, which does not exclude devices that are applicable to or configured to perform additional tasks or steps.

In addition, the use of the phrase "based on" indicates openness and inclusiveness, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary accompanying drawings. In the accompanying drawings, thicknesses of layers and regions are enlarged for clarity. Thus, variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

A display panel of an AMOLED display screen requires a large current during an operation process. The higher the brightness of the display panel, the greater the current required to be input. When the display panel displays some special images (e.g., game images with complex content), the current input into the display panel is too large, which makes the display panel generate large quantities of heat during the operation process, so that the display panel is prone to damage and fails to display images normally.

Based on this, some embodiments of the present disclosure provide a display module 100. Referring to FIG. 1, the display module 100 includes a display panel 1, a power supply driver 2, a voltage signal line 3, a sampling resistor 4, and a detection and control circuit 5.

The display panel 1 may include a substrate and a plurality of sub-pixels disposed on the substrate and arranged in an array. Each sub-pixel includes a light-emitting device and a driver circuit that are disposed on the substrate, and the driver circuit includes a plurality of thin film transistors. The light-emitting device includes an anode, a light-emitting functional layer, and a cathode. The anode is electrically connected to a drain of a thin film transistor serving as a driving transistor among the plurality of thin film transistors.

Based on this, in some examples, the voltage signal line 3 is an ELVDD line. In this case, the voltage signal line 3 may be electrically connected to a source of the thin film transistor serving as the driving transistor among the plurality of thin film transistors. In some other examples, the voltage signal line 3 is an ELVSS line. In this case, the voltage signal line 3 may be electrically connected to the cathode of the light-emitting device.

The power supply driver 2 is configured to generate a driving voltage. The driving voltage is within a range of 0.25 V to 16.5 V. The power supply driver 2 is connected to the display panel 1 through the voltage signal line 3, and transmits the driving voltage to the display panel 1 through the voltage signal line 3, so that the display panel 1 emits light.

For example, the power supply driver 2 includes a switching power supply device, a direct current regulated power supply device, an alternating current power supply device or other types of power supply device.

The sampling resistor 4 is connected in series with the voltage signal line 3. The detection and control circuit 5 is connected to two ends of the sampling resistor 4, and the detection and control circuit 5 is configured to detect a voltage across the sampling resistor 4 or a current flowing through the sampling resistor 4. The voltage across the sampling resistor is within a range of 0 mV to 2 mV.

The detection and control circuit 5 is further connected to the power supply driver 2. The detection and control circuit 5 is further configured to: if the detection and control circuit 5 determines that the voltage is greater than or equal to the voltage threshold, control the power supply driver 2 to generate a driving voltage that is lowered to (i.e., equal to) a preset value lower than a voltage threshold; or, if the detection and control circuit 5 determines that the current is greater than or equal to a current threshold, control the power supply driver 2 to generate the driving voltage that is lowered to the preset value lower than the voltage threshold. The voltage threshold is within a range of 1 mV to 2 mV, and the current threshold is within a range of 0.5 A to 1 A.

With such arrangement, a current change in the voltage signal line 3 may be obtained in real time, and when the voltage across the sampling resistor 4 exceeds the voltage threshold or the current flowing through the sampling resistor 4 exceeds the current threshold, a magnitude of the driving voltage is controlled in time. As a result, the current in the voltage signal line 3 is reduced, which may prevent the display panel 1 from being damaged due to an excessive current in the voltage signal line 3 and avoid a problem that the display panel 1 cannot perform display normally.

The preset value may be, for example, 0 V. In this case, the display panel 1 displays a black image. Thus, the display panel 1 may be stably and effectively protected.

Figure 2:
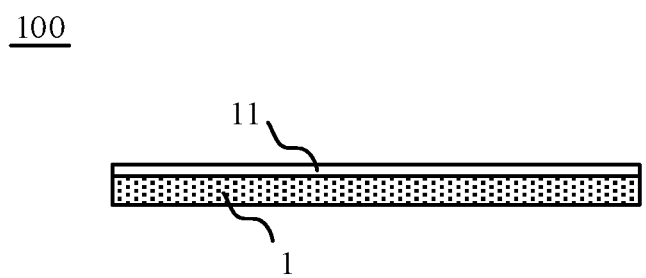
FIG. 2 is a structural diagram of another display module, in accordance with some embodiments.

In some embodiments, referring to FIG. 2, the display module 100 further includes a polarizer 11, and the polarizer 11 is disposed on a display side of the display panel 1. The polarizer 11 may play a role of preventing an interference of external light during a light-emitting process of the display panel 1, thereby ensuring a normal display of the display panel 1.

It will be noted that, in a case where the polarizer 11 is provided, if a current transmitted to the display panel 1 through the voltage signal line 3 is too large, the display panel 1 will have severe heating, which is likely to exceed a tolerance limit of the polarizer 11. In this case, the polarizer 11 is likely to be yellowish, thereby causing the display panel 1 to fail to perform display normally. However, in the display module 100 provided in some of the above embodiments, since the current change in the voltage signal line 3 may be obtained in real time, and the magnitude of the driving voltage may be controlled in time when the voltage across the sampling resistor 4 exceeds the voltage threshold or the current flowing through the sampling resistor 4 exceeds the current threshold, the current in the voltage signal line 3 is reduced, and the problem that the display panel 1 cannot perform display normally due to the yellowish polarizer 11 may be effectively prevented.

Figure 3:
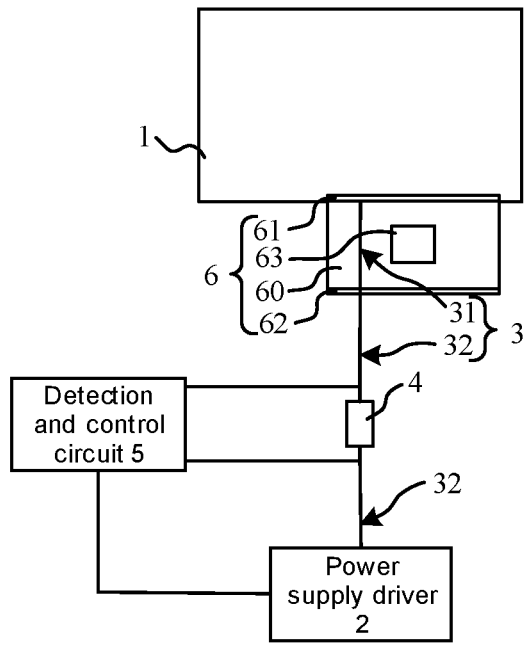
FIG. 3 is a structural diagram of yet another display module, in accordance with some embodiments.
Figure 4:
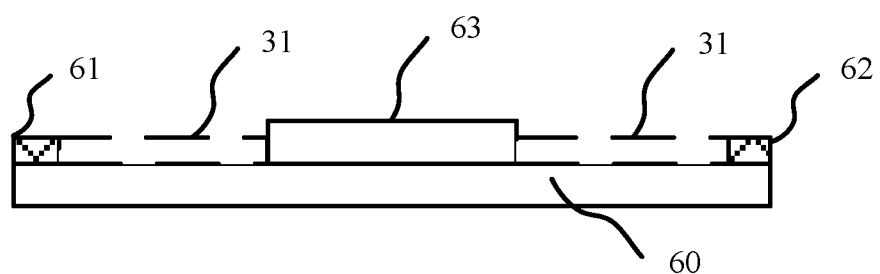
FIG. 4 is a structural diagram of a chip-on-film circuit board, in accordance with some embodiments.

In some embodiments, as shown in FIGS. 3 and 4, the display module 100 further includes a chip-on-film circuit board 6. The chip-on-film circuit board 6 includes a substrate 60, and a first connection electrode 61 and a second connection electrode 62 that are located on the substrate 60. For example, the first connection electrode 61 and the second connection electrode 62 are located on a same side of the substrate 60. Alternatively, the first connection electrode 61 and the second connection electrode 62 are located on different sides of the substrate 60, as long as the first connection electrode 61 and the second connection electrode 62 are connected.

The first connection electrode 61 is connected to the display panel 1. The voltage signal line 3 includes a first conductive portion 31 located on the substrate 60 and connected between the first connection electrode 61 and the second connection electrode 62, and a second conductive portion 32 connected between the second connection electrode 62 and the power supply driver 2. The sampling resistor 4 is connected with the second conductive portion 32.

It is worth noting that, the greater the current in the voltage signal line 3, the more severe the heating of the first conductive portion 31 located on the substrate 60. The chip-on-film circuit board 6 has poor heat resistance. When the heat generated by the first conductive portion 31 exceeds a tolerance limit of the chip-on-film circuit board 6, the chip-on-film circuit board 6 is likely to be burnt. Moreover, since the chip-on-film circuit board 6 is bonded to the display panel 1 through the first connection electrode 61, a severe yellowish phenomenon is likely to occur at a position on the polarizer 11 proximate to the chip-on-film circuit board 6.

In some of the above embodiments, by arranging the sampling resistor 4 between portions of the second conductive portion 32, the current change in the voltage signal line 3 may be detected in time. For example, when the voltage across the sampling resistor 4 exceeds the voltage threshold or the current flowing through the sampling resistor 4 exceeds the current threshold, the magnitude of the driving voltage is controlled in time to reduce the current in the voltage signal line 3. As a result, it is possible to effectively prevent the problem that the display panel 1 cannot perform display normally due to the burnt chip-on-film circuit board 6 or the yellowish polarizer 11.

The substrate 60 may be made of a flexible polyimide (PI) material.

For example, referring to FIGS. 3 and 4, the chip-on-film circuit board 6 may be further equipped with chip(s) 63 (e.g., a display driver chip and/or a touch control chip), and the chip 63 may be packaged on the substrate 60 through a chip on film. In this case, by bending the chip-on-film circuit board 6, the chip 63 may be moved to a back side of the display panel 1. Therefore, it is more conducive to a narrow bezel design after the display module 100 is applied in a display apparatus.

Figure 5:
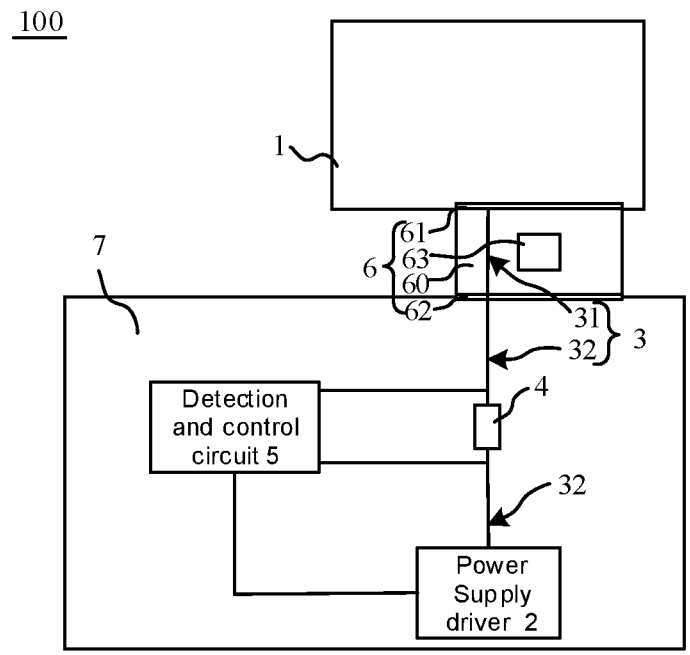
FIG. 5 is a structural diagram of yet another display module, in accordance with some embodiments.

In some embodiments, referring to FIG. 5, the display module 100 further includes a main control circuit board 7, and the main control circuit board 7 is connected to the second connection electrode 62. For example, the main control circuit board 7 may be provided with a plug connector, and the second connection electrode 62 of the chip-on-film circuit board 6 may be connected to the plug connector of the main control circuit board 7 in a plug-in manner.

Based on this, the second conductive portion 32, the sampling resistor 4, the power supply driver 2 and the detection and control circuit 5 are all located on the main control circuit board 7. With such design, the second conductive portion 32, the sampling resistor 4, the power supply driver 2 and the detection and control circuit 5 may be integrated on the main control circuit board 7, which improves the integration of the display module 100. When the display module 100 shakes, the second conductive portion 32, the sampling resistor 4, the power supply driver 2 and the detection and control circuit 5 are less likely to shake, and thus are less likely to fail.

Figure 6:
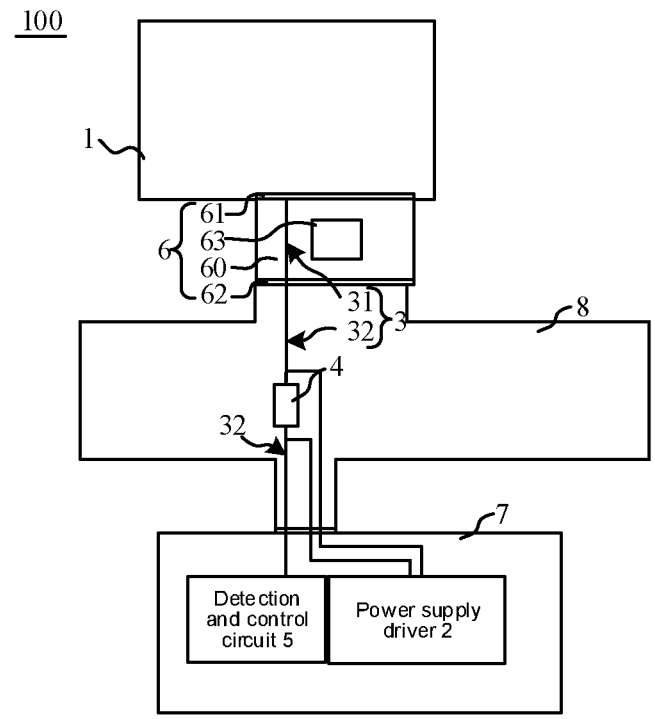
FIG. 6 is a structural diagram of yet another display module, in accordance with some embodiments.

In some other embodiments, referring to FIG. 6, the display module 100 further includes a main control circuit board 7 and a flexible circuit board 8. The flexible circuit board 8 is connected between the main control circuit board 7 and the second connection electrode 62 of the chip-on-film circuit board 6. The second conductive portion 32 and the sampling resistor 4 are located on the flexible circuit board 8, and the power supply driver 2 and the detection and control circuit 5 are located on the main control circuit board 7. By providing the flexible circuit board 8, it may be possible to facilitate the arrangement of the voltage signal lines 3 in the display module 100, and reduce the burden of the main control circuit board 7.

Figure 7:
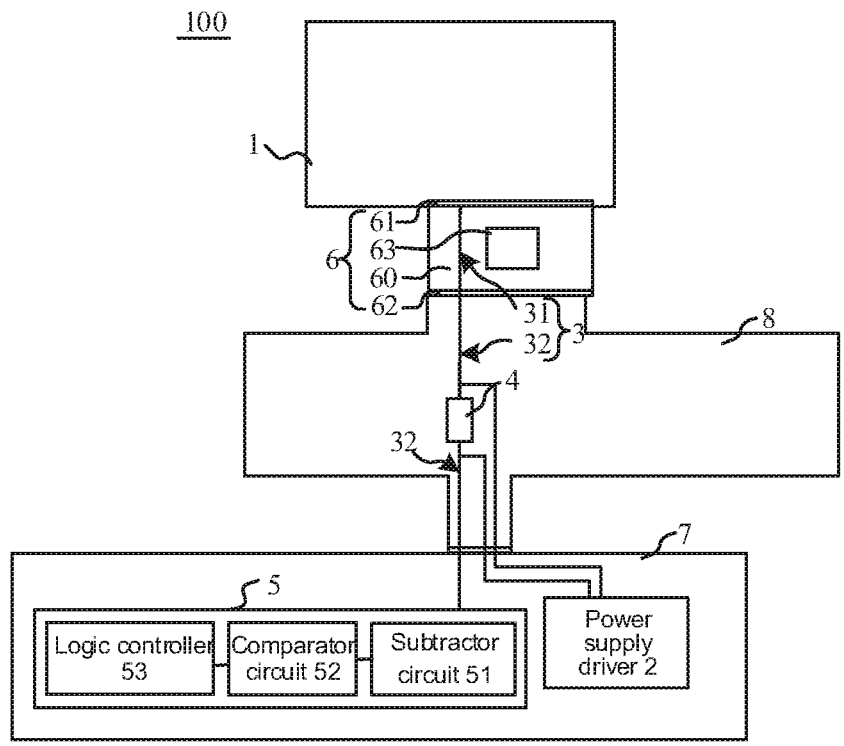
FIG. 7 is a structural diagram of yet another display module, in accordance with some embodiments.

In some embodiments, referring to FIG. 7, the detection and control circuit 5 includes a subtractor circuit 51, a comparator circuit 52, and a logic controller 53. The subtractor circuit 51 is connected to the two ends of the sampling resistor 4. The comparator circuit 52 is connected to the subtractor circuit 51. The logic controller 53 is connected to the comparator circuit 52, and the logic controller 53 is further connected to the power supply driver 2.

The subtractor circuit 51 is configured to obtain potentials at the two ends of the sampling resistor 4, and calculate a difference between the potentials at the two ends of the sampling resistor 4 according to the potentials at the two ends of the sampling resistor 4. The difference is the voltage across the sampling resistor 4.

Figure 21:
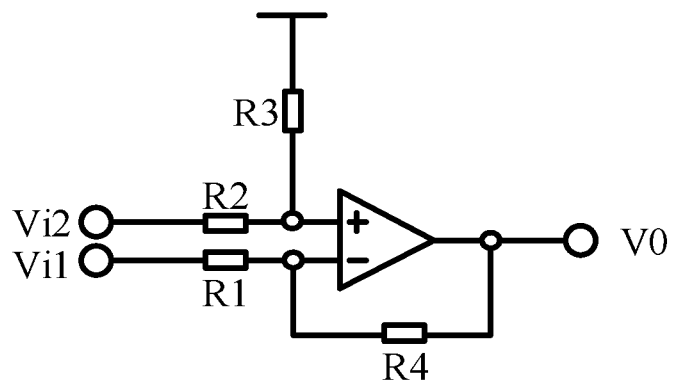
FIG. 21 is a structural diagram of a subtractor circuit, in accordance with some embodiments.

For example, as shown in FIG. 21, the subtractor circuit 51 includes a first operational amplifier. A first input terminal (e.g., an reverse input terminal) of the first operational amplifier is connected to a first terminal of the sampling resistor 4 through a first resistor R1, and a potential of the first terminal of the sampling resistor 4 is Vi1. A second input terminal (e.g., a non-reverse input terminal) of the first operational amplifier is connected to a second terminal of the sampling resistor 4 through a second resistor R2, and a potential of the second terminal of the sampling resistor 4 is Vi2. An output terminal of the first operational amplifier is connected to the comparator circuit 52. The voltage across the sampling resistor 4 calculated by the subtractor circuit 51 is transmitted to the comparator circuit 52 through the output terminal of the first operational amplifier.

In addition, the second input terminal of the first operational amplifier is further grounded through a third resistor R3. The first input terminal of the first operational amplifier is further connected to the output terminal of the first operational amplifier through a fourth resistor R4. In a case where a ratio of R4 and R1 is equal to a ratio of R3 and R2

$$\left(\text{i.e., } \frac{R4}{R1} = \frac{R3}{R2}\right),$$

a voltage V0 mat is output from the output terminal of the first operational amplifier satisfies a condition that, V0 is equal to a ratio of R4 and R1 multiplied by a difference between Vi2 and Vi1

$$\left(\text{i.e., } \frac{R4}{R1}(Vi2 - Vi1)\right).$$

V0 is the voltage across the sampling resistor 4.

The comparator circuit 52 is configured to obtain the voltage across the sampling resistor 4 calculated by the subtractor circuit 51, and compare the voltage across the sampling resistor 4 with the voltage threshold to obtain a comparison result.

Figure 22:
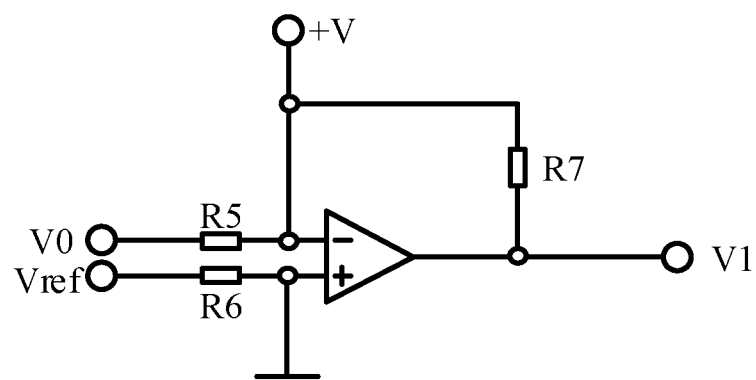
FIG. 22 is a structural diagram of a comparator circuit, in accordance with some embodiments.

For example, referring to FIGS. 21 and 22, the comparator circuit 52 includes a second operational amplifier. A first input terminal (e.g., an reverse input terminal) of the second operational amplifier is connected to the output terminal of the first operational amplifier of the subtractor circuit 51 through a fifth resistor R5. A second input terminal (e.g., a non-reverse input terminal) of the second operational amplifier is grounded and connected to a reference voltage terminal through a sixth resistor R6. A signal input to the reference voltage terminal is a threshold voltage Vref. An output terminal of the second operational amplifier is connected to the logic controller 53.

In addition, the first input terminal of the second operational amplifier is connected to a positive voltage terminal, and the positive voltage terminal provides a positive voltage signal+V to the second operational amplifier. The first input terminal of the second operational amplifier is further connected to the output terminal of the second operational amplifier through a seventh resistor R7.

Figure 23:
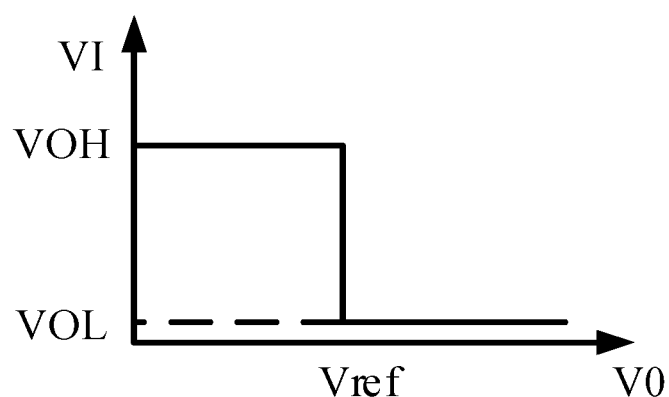
FIG. 23 is an output voltage diagram of a comparator circuit, in accordance with some embodiments.

In this case, as shown in FIGS. 22 and 23, when a signal (i.e., the voltage V0 across the sampling resistor) output from the output terminal of the first operational amplifier is less than the signal (i.e., the threshold voltage Vref) from the reference voltage terminal, a signal V1 output from the output terminal of the second operational amplifier is a high-level signal VOH. When the signal output from the output terminal of the first operational amplifier is greater than or equal to the signal from the reference voltage terminal, the signal V1 output from the output terminal of the second operational amplifier is a low-level signal VOL.

In some other examples, the first input terminal of the second operational amplifier may also be used as the non-reverse input terminal, while the second input terminal of the second operational amplifier is the reverse input terminal. In this case, the first input terminal of the second operational amplifier is connected to the reference voltage terminal, while the second input terminal of the second operational amplifier is connected to the output terminal of the first operational amplifier of the subtractor circuit 51. The working processes may be referred to the above description, which will not be repeated here.

The logic controller 53 is configured to: if the comparison result is that the voltage is greater than or equal to the voltage threshold, control the power supply driver 2 to generate the driving voltage lowered to the preset value lower than the voltage threshold.

For example, the logic controller 53 includes a digital signal processor (DSP), a hardware microprocessor, a programmable logic device (PLD), a field programmable gate array (FPGA), a single chip microcomputer, an application-specific integrated circuit (ASIC) or other types of hardware logic circuits.

When the preset value is 0 V, the display panel 1 displays the black image. When the preset value is within a safe operating range of 0 V to the voltage threshold, the display panel 1 displays an image with low brightness, thereby preventing the display panel 1 from being damaged and thus failing to perform display normally.

With such arrangement, a voltage detection function, a function of a comparison between the voltage and the voltage threshold, and a function of responding and controlling the power supply driver 2 after the comparison are implemented by different pieces of hardware. That is, the above functions are achieved through mutual cooperation among the subtractor circuit 51, the comparator circuit 52, and the logic controller 53. In this way, when the voltage of the sampling resistor 4 exceeds the threshold voltage, a quick response may be made. For example, the power supply driver 2 may be quickly controlled to generate the driving voltage lowered to the preset value, so that the display panel 1 is effectively protected in time.

Figure 8:
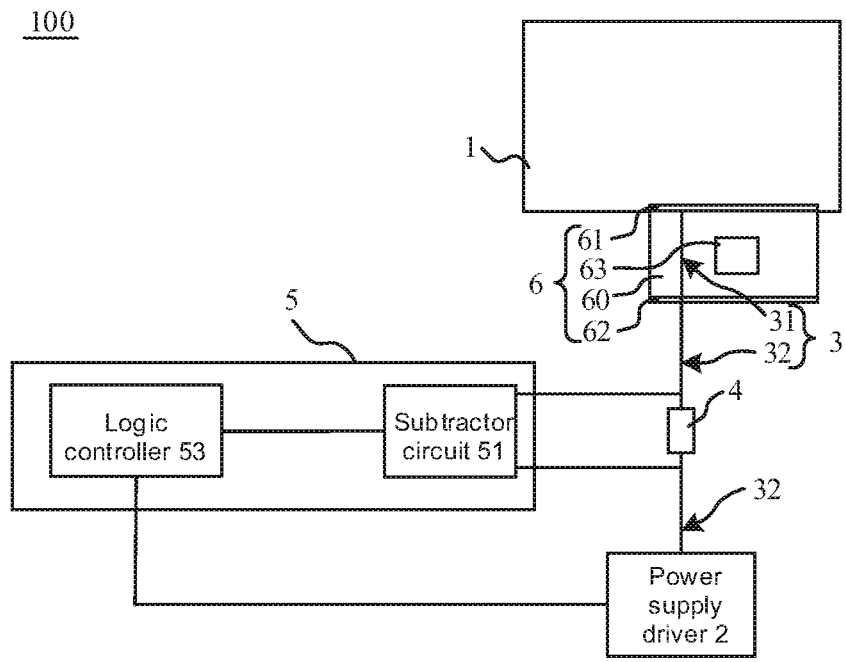
FIG. 8 is a structural diagram of yet another display module, in accordance with some embodiments.

In some embodiments, referring to FIG. 8, the detection and control circuit 5 includes a subtractor circuit 51 and a logic controller 53. The subtractor circuit 51 is connected to the two ends of the sampling resistor 4, and the subtractor circuit 51 is further connected to the logic controller 53.

The subtractor circuit 51 is configured to obtain the potentials at the two ends of the sampling resistor 4, and calculate the difference between the potentials at the two ends of the sampling resistor 4. The difference is the voltage across the sampling resistor 4.

The substractor circuit 51 may have a same circuit configuration as the substractor circuit 51 described with reference to FIG. 21.

The logic controller 53 is configured to compare the voltage across the sampling resistor 4 with the voltage threshold to obtain the comparison result, and if the comparison result is that the voltage is greater than or equal to the voltage threshold, control the power supply driver 2 to generate the driving voltage lowered to the preset value lower than the voltage threshold.

Alternatively, the logic controller 53 is configured to: obtain a resistance of the sampling resistor 4; calculate the current flowing through the sampling resistor 4 according to the resistance of the sampling resistor 4 and the voltage across the sampling resistor 4; compare the current flowing through the sampling resistor 4 with the current threshold to obtain a comparison result; and if the comparison result is that the current is greater than or equal to the current threshold, control the power supply driver 2 to generate the driving voltage lowered to the preset value lower than the voltage threshold. The current flowing through the sampling resistor 4 is a ratio between the voltage across the sampling resistor 4 obtained by the subtractor circuit 51 and the resistance of the sampling resistor 4.

For example, the logic controller 53 includes a digital signal processor (DSP), a hardware microprocessor, a programmable logic device (PLD), a field programmable gate array (FPGA), a single chip microcomputer, an application-specific integrated circuit (ASIC) or other types of hardware logic circuits.

With such arrangement, the function of the comparison between the voltage and the voltage threshold, or both a function of converting the voltage into the current and a function of a comparison between the current and the current threshold may be integrated in the logic controller 53, which is beneficial to simplify an overall structure of the display module 100.

Figure 9:
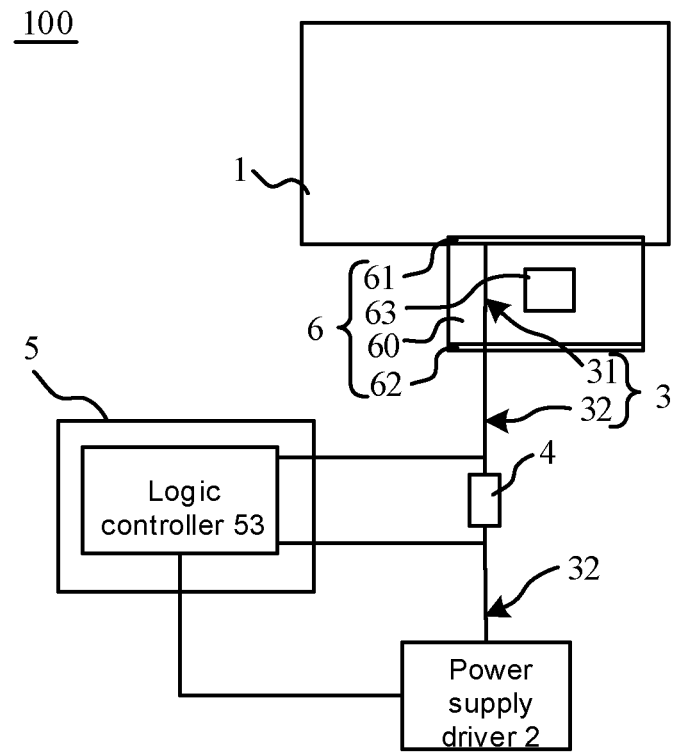
FIG. 9 is a structural diagram of yet another display module, in accordance with some embodiments.

In some embodiments, referring to FIG. 9, the detection and control circuit 5 includes a logic controller 53. The logic controller 53 is connected to the two ends of the sampling resistor 4.

The logic controller 53 is configured to obtain the potentials at the two ends of the sampling resistor 4, and calculate the difference between the potentials at the two ends of the sampling resistor 4. The difference is the voltage across the sampling resistor 4.

The logic controller 53 is further configured to compare the voltage across the sampling resistor 4 with the voltage threshold to obtain the comparison result, and if the comparison result is that the voltage is greater than or equal to the voltage threshold, control the power supply driver 2 to generate the driving voltage lowered to the preset value lower than the voltage threshold.

Alternatively, the logic controller 53 is further configured to: obtain the resistance of the sampling resistor 4; calculate the current flowing through the sampling resistor 4 according to the resistance of the sampling resistor 4 and the voltage across the sampling resistor 4; compare the current flowing through the sampling resistor 4 with the current threshold to obtain the comparison result; and control the power supply driver 2 to generate the driving voltage lowered to the preset value lower than the voltage threshold if the comparison result is that the current is greater than or equal to the current threshold.

For example, the logic controller 53 includes a digital signal processor (DSP), a hardware microprocessor, a programmable logic device (PLD), a field programmable gate array (FPGA), a single chip microcomputer, an application-specific integrated circuit (ASIC) or other types of hardware logic circuits.

With such arrangement, the voltage (or current) detection function, the function of the comparison between the voltage and the voltage threshold (or the function of the comparison between the current and the current threshold), and the function of responding and controlling the power supply driver 2 after the comparison may be all integrated in the logic controller 53, which is beneficial to further simplify the overall structure of the display module 100.

Figure 10:
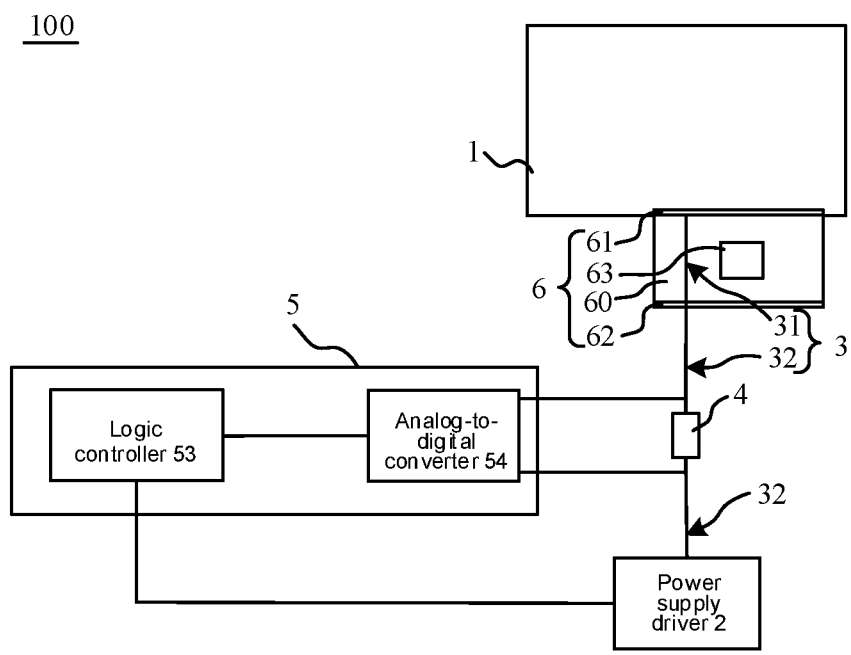
FIG. 10 is a structural diagram of yet another display module, in accordance with some embodiments.

In some embodiments, referring to FIG. 10, the display module 100 further includes an analog-to-digital converter 54, and the analog-to-digital converter 54 is connected between the logic controller 53 and the sampling resistor 4. The analog-to-digital converter 54 is configured to convert the potentials at the two ends of the sampling resistor 4 from analog potential signals into digital potential signals, and then output the digital potential signals to the logic controller 53.

For example, the analog-to-digital converter 54 includes an integral analog-to-digital converter, a successive approximation analog-to-digital converter, a flicker analog-to-digital converter, a sigma-delta analog-to-digital converter or other types of analog-to-digital converters.

In this embodiment, the analog-to-digital converter 54 may be used to directly convert the analog potential signals that are measured in real time at the two ends of the sampling resistor 4 into the digital potential signals. In this way, it is helpful for the subsequent logic controller 53 to calculate the voltage across the sampling resistor 4 or the current flowing through the sampling resistor 4 more quickly, thereby increasing a speed of feedback control of the power supply driver 2 and improving safety.

Figure 11:
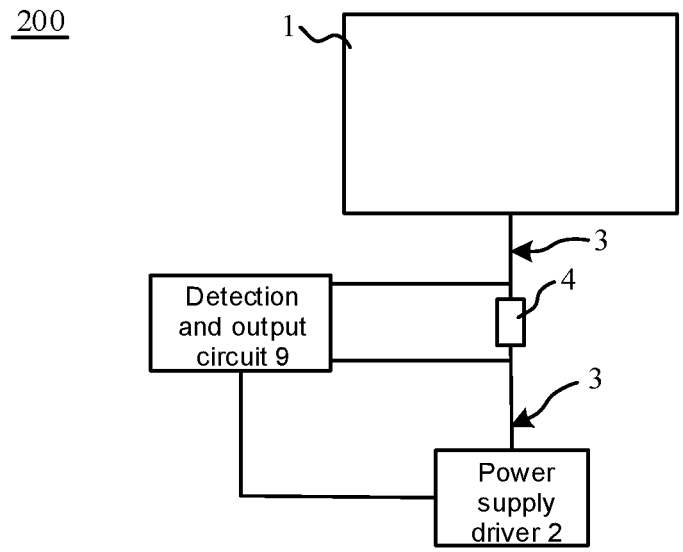
FIG. 11 is a structural diagram of yet another display module, in accordance with some embodiments.

In some embodiments of the present disclosure, another display module 200 is also provided. Referring to FIG. 11, the display module 200 includes the display panel 1, the power supply driver 2, the voltage signal line 3, the sampling resistor 4, and a detection and output circuit 9. The voltage signal line 3 is connected between the display panel 1 and the power supply driver 2. The sampling resistor 4 is connected in series with the voltage signal line 3. The detection and output circuit 9 is connected to the two ends of the sampling resistor 4.

The detection and output circuit 9 is configured to detect and output the voltage across the sampling resistor 4 or the current flowing through the sampling resistor 4.

For example, the detection and output circuit 9 includes a current detection chip, a voltage detection chip or other types of chips.

With such arrangement, the current change in the voltage signal line 3 may be monitored. When the current in the voltage signal line 3 is too large to cause damage to the display panel 1, the voltage across the sampling resistor 4 or the current flowing through the sampling resistor 4 at this time may be output. In this case, the voltage across the sampling resistor 4 or the current flowing through the sampling resistor 4 may be served as an important reference for setting the voltage threshold or the current threshold. For example, the output value may be directly served as the voltage threshold or the current threshold. For another example, a value slightly lower than the output value may be served as the voltage threshold or the current threshold.

Figure 12:
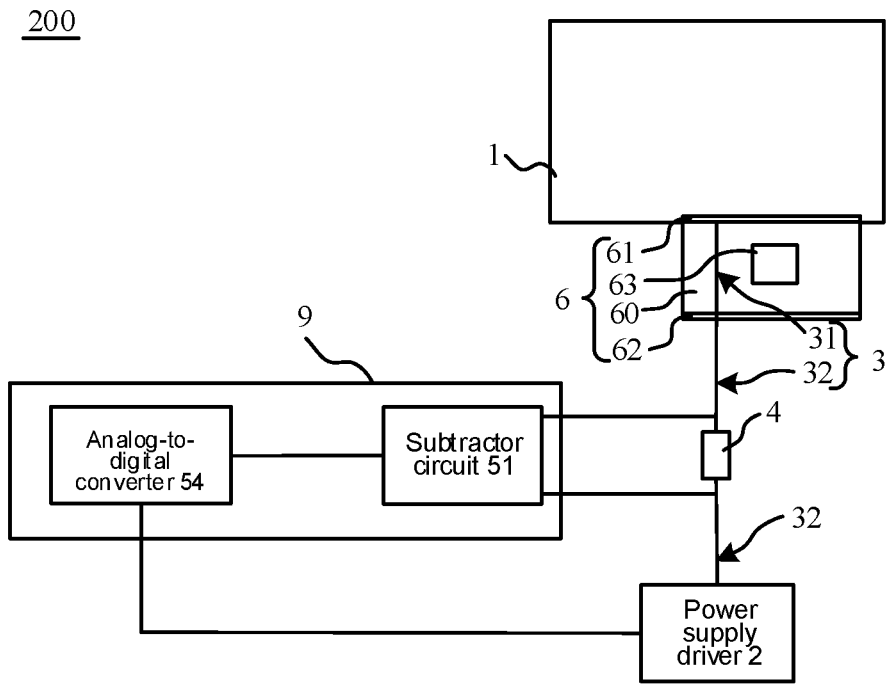
FIG. 12 is a structural diagram of yet another display module, in accordance with some embodiments.

In some embodiments, referring to FIG. 12, the detection and output circuit 9 includes the subtractor circuit 51 and the analog-to-digital converter 54. The subtractor circuit 51 is connected to the two ends of the sampling resistor 4. The analog-to-digital converter 54 is connected to the subtractor circuit 51.

The subtractor circuit 51 is configured to obtain the potentials at the two ends of the sampling resistor 4, and calculate the difference between the potentials at the two ends of the sampling resistor 4 according to the potentials at the two ends of the sampling resistor 4. The difference is the voltage across the sampling resistor 4.

The substractor circuit 51 may have a same circuit configuration as the substractor circuit 51 described with reference to FIG. 21.

The analog-to-digital converter 54 is connected to the subtractor circuit 51, and the analog-to-digital converter 54 is configured to convert the voltage across the sampling resistor 4 obtained by calculation from an analog voltage signal into a digital voltage signal, and output the digital voltage signal.

For example, the analog-to-digital converter 54 includes an integral analog-to-digital converter, a successive approximation analog-to-digital converter, a flicker analog-to-digital converter, a sigma-delta analog-to-digital converter or other types of analog-to-digital converters.

With such arrangement, the digital voltage signal may facilitate reading of a real-time voltage across the sampling resistor 4 by a tester, and also facilitate the setting of specific values of the voltage threshold or the current threshold. During a setting process, for example, the following setting manners may be used.

The above display module 200 is used, and the driving voltage is gradually increased, so that the current in the voltage signal line 3 is increased. When observing that the polarizer 11 on the display panel 1 shows signs of yellowing or the display panel 1 performs display abnormally (e.g., is in a state of partial black screen or full black screen), the tester selects a maximum value of voltage data output by the analog-to-digital converter 54. The maximum value may be set as the voltage threshold. The current threshold is a ratio between the voltage threshold and the resistance of the sampling resistor 4.

It will be noted that, the voltage threshold may also be set to a value slightly less than the maximum value (e.g., a value not lower than 0.8 times the maximum value), which may protect the display panel 1 more safely and avoid a current proximate to or equal to the current threshold in the voltage signal line 3 during the operation process of the display panel 1 and thus directly causing the display panel 1 to fail to perform display normally.

The specific resistance of the sampling resistor 4 is not limited in the present disclosure, as long as the sampling resistor 4 may be connected in series with the voltage signal line 3 and not affect the normal display of the display panel 1. It will be noted that, the resistance of the sampling resistor 4 should be as small as possible, so as to reduce its influence on the current change in the voltage signal line 3.

For example, the resistance of the sampling resistor is within a range of 1 mΩ to 2 mΩ, and the resistance of the sampling resistor may be, for example, 1 mΩ, 1.1 mΩ, 1.5 mΩ, 1.8 mΩ or 2 mΩ.

Figure 13:
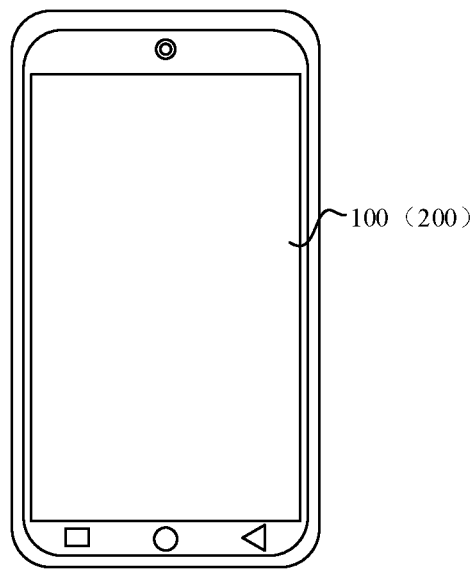
FIG. 13 is a structural diagram of a display apparatus, in accordance with some embodiments.

In some embodiments of the present disclosure, a display apparatus 300 is provided. As shown in FIG. 13, the display apparatus 300 includes the display module 100 of any of the above embodiments or the display module 200 of any of the above embodiments.

Since the display apparatus 300 includes the display module 100 of some of the above embodiments or the display module 200 of any of the above embodiments, the display apparatus 300 has all the same beneficial effects as the display module 100 or the display module 200, which will not be repeated herein.

The display apparatus 300 may be, for example, any product or component having a display function, such as a mobile phone, a tablet computer, a television, a display, a notebook computer, a digital photo frame, or a navigator.

Figure 14:
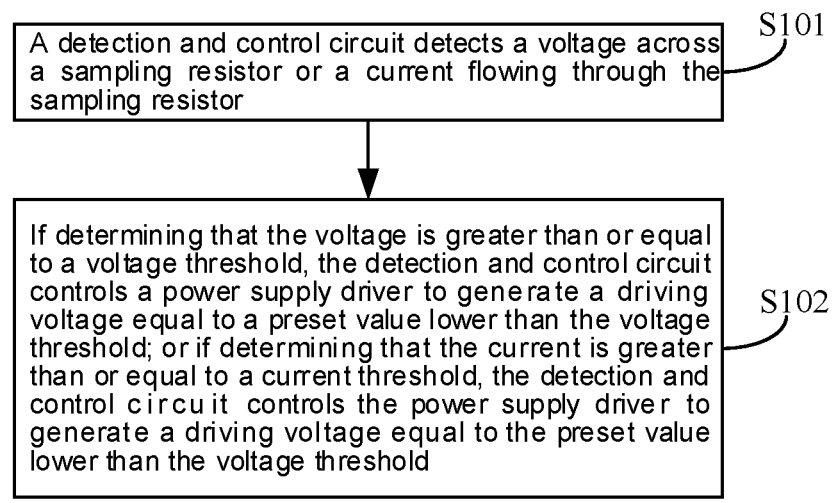
FIG. 14 is a flow diagram of a method for driving a display module, in accordance with some embodiments.

Some embodiments of the present disclosure provides a method for driving a display module. Referring to FIG. 1, the display module 100 includes the display panel 1, the power supply driver 2, the voltage signal line 3, the sampling resistor 4 and the detection and control circuit 5. Based on this, referring to FIG. 14, the method includes S101 and S102.

In S101, the detection and control circuit 5 detects the voltage across the sampling resistor 4 or the current flowing through the sampling resistor 4.

In S102, if determining that the voltage is greater than or equal to the voltage threshold, the detection and control circuit 5 controls the power supply driver 2 to generate the driving voltage lowered to the preset value lower than the voltage threshold; or, if determining that the current is greater than or equal to the current threshold, the detection and control circuit 5 controls the power supply driver 2 to generate the driving voltage lowered to the preset value lower than the voltage threshold.

With such arrangement, the detection and control circuit 5 obtains the current change in the voltage signal line 3 in real time, and controls the magnitude of the driving voltage in time when the voltage across the sampling resistor 4 exceeds the voltage threshold or the current flowing through the sampling resistor 4 exceeds the current threshold, so as to reduce the current in the voltage signal line 3. As a result, it may be possible to prevent the display panel 1 from being damaged due to the excessive current in the voltage signal line 3 and avoid the problem that the display panel 1 cannot perform display normally.

Figure 15:
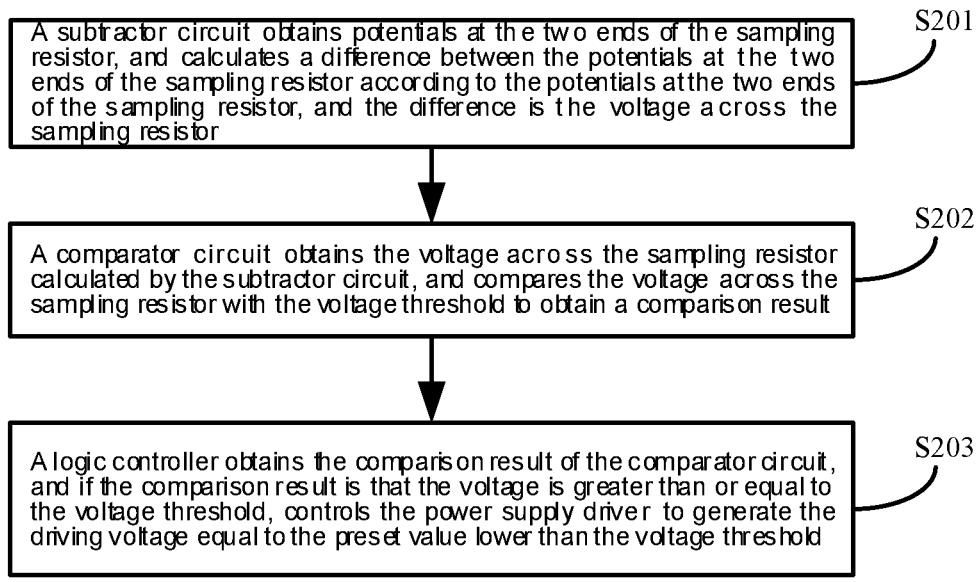
FIG. 15 is a flow diagram of another method for driving a display module, in accordance with some embodiments.

For example, referring to FIG. 7, the detection and control circuit 5 includes the subtractor circuit 51, the comparator circuit 52 and the logic controller 53. Based on this, referring to FIG. 15, the method includes S201 to S203.

In S201, the subtractor circuit 51 obtains potentials at the two ends of the sampling resistor 4, and calculates the difference between the potentials at the two ends of the sampling resistor 4 according to the potentials at the two ends of the sampling resistor 4. The difference is the voltage across the sampling resistor 4.

In S202, the comparator circuit 52 obtains the voltage across the sampling resistor 4 calculated by the subtractor circuit 51, and compares the voltage across the sampling resistor 4 with the voltage threshold to obtain the comparison result.

In S203, the logic controller 53 obtains the comparison result of the comparator circuit 52, and if the comparison result is that the voltage is greater than or equal to the voltage threshold, controls the power supply driver 2 to generate the driving voltage lowered to the preset value lower than the voltage threshold.

With such arrangement, a voltage detection function, a function of a comparison between the voltage and the voltage threshold, and a function of responding and controlling the power supply driver 2 after the comparison are implemented by different pieces of hardware. That is, the above functions are achieved through mutual cooperation among the subtractor circuit 51, the comparator circuit 52, and the logic controller 53. In this way, when the voltage of the sampling resistor 4 exceeds the threshold voltage, a quick response may be made. For example, the power supply driver 2 may be quickly controlled to generate the driving voltage lowered to the preset value, so that the display panel 1 is effectively protected in time.

Figure 16:
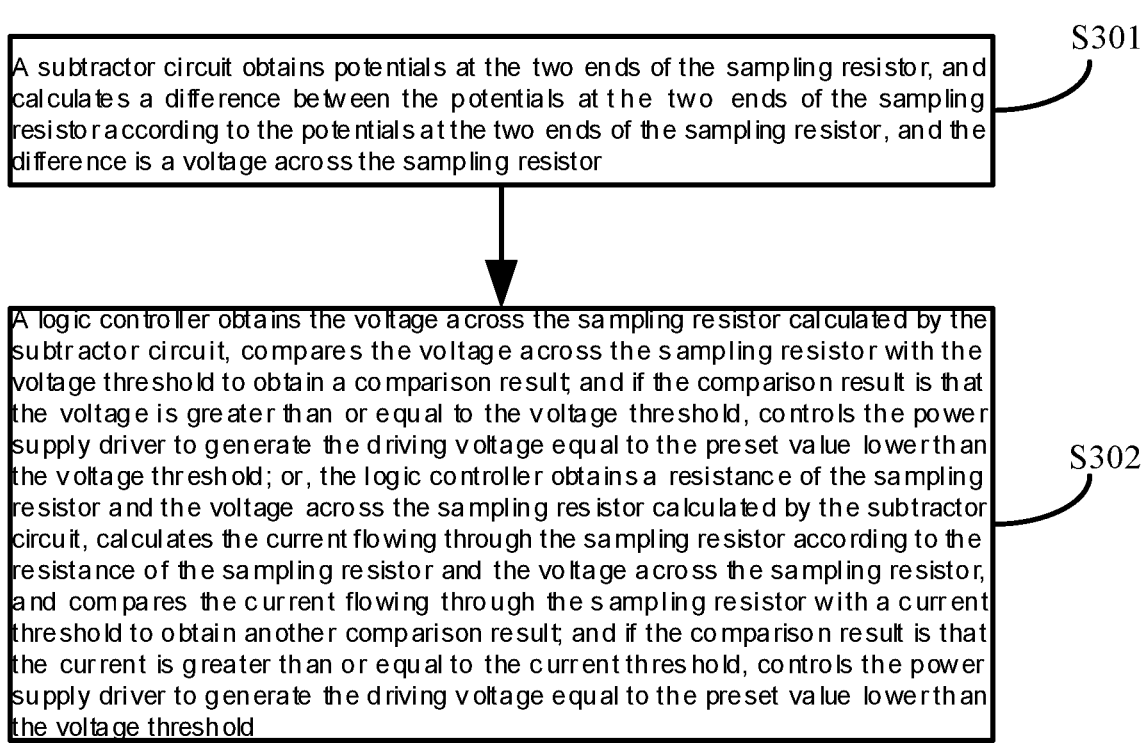
FIG. 16 is a flow diagram of yet another method for driving a display module, in accordance with some embodiments.

For example, referring to FIG. 8, the detection and control circuit 5 includes the subtractor circuit 51 and the logic controller 53. Based on this, referring to FIG. 16, the method includes S301 and S302.

In S301, the subtractor circuit 51 obtains the potentials at the two ends of the sampling resistor 4, and calculates the difference between the potentials at the two ends of the sampling resistor 4 according to the potentials at the two ends of the sampling resistor 4. The difference is the voltage across the sampling resistor 4.

In S302, the logic controller 53 obtains the voltage across the sampling resistor 4 calculated by the subtractor circuit 51, compares the voltage across the sampling resistor 4 with the voltage threshold to obtain the comparison result, and if the comparison result is that the voltage is greater than or equal to the voltage threshold, controls the power supply driver 2 to generate the driving voltage lowered to the preset value lower than the voltage threshold. Alternatively, the logic controller 53 obtains the resistance of the sampling resistor 4 and the voltage across the sampling resistor 4 calculated by the subtractor circuit 51, calculates the current flowing through the sampling resistor 4 according to the resistance of the sampling resistor 4 and the voltage across the sampling resistor 4, compares the current flowing through the sampling resistor 4 with the current threshold to obtain the comparison result, and controls the power supply driver 2 to generate the driving voltage lowered to the preset value lower than the voltage threshold if the comparison result is that the current is greater than or equal to the current threshold.

With such arrangement, the function of the comparison between the voltage and the voltage threshold, or both a function of converting the voltage into the current and a function of a comparison between the current and the current threshold may be integrated in the logic controller 53, which is beneficial to simplify an overall structure of the display module 100.

Figure 17:
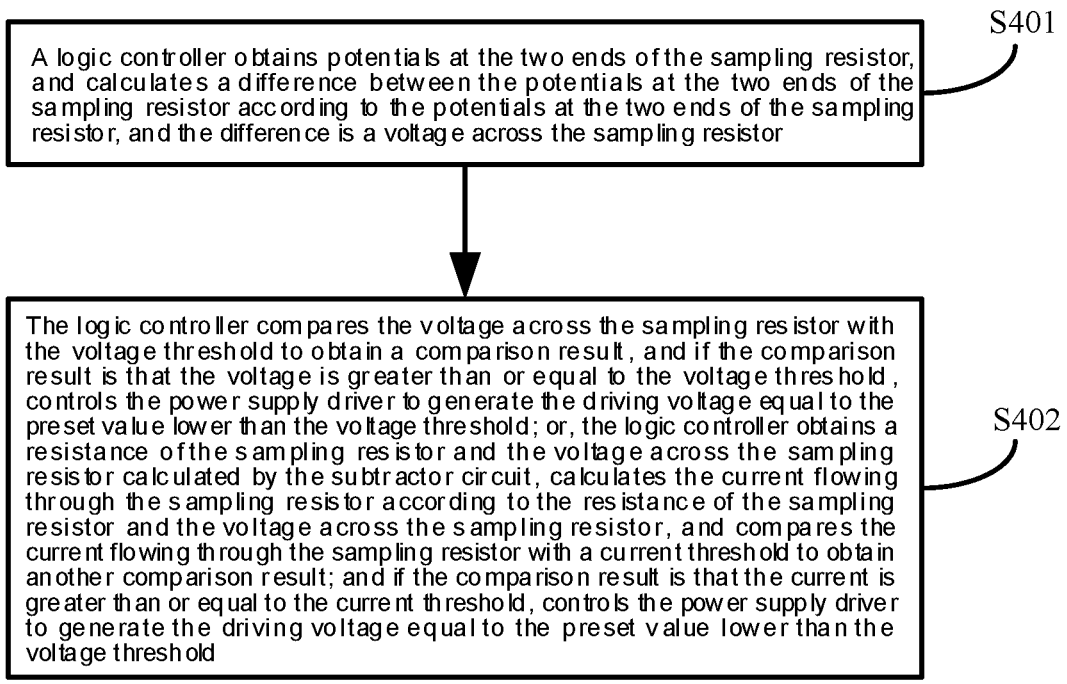
FIG. 17 is a flow diagram of yet another method for driving a display module, in accordance with some embodiments.

For example, referring to FIG. 9, the detection and control circuit 5 includes the logic controller 53. Based on this, referring to FIG. 17, the method includes S401 and S402.

In S401, the logic controller 53 obtains the potentials at the two ends of the sampling resistor 4, and calculates the difference between the potentials at the two ends of the sampling resistor 4 according to the potentials at the two ends of the sampling resistor 4. The difference is the voltage across the sampling resistor 4.

In S402, the logic controller 53 compares the voltage across the sampling resistor 4 with the voltage threshold to obtain the comparison result, and if the comparison result is that the voltage is greater than or equal to the voltage threshold, controls the power supply driver 2 to generate the driving voltage lowered to the preset value lower than the voltage threshold. Alternatively, the logic controller 53 obtains the resistance of the sampling resistor 4, calculates the current flowing through the sampling resistor 4 according to the resistance of the sampling resistor 4 and the voltage across the sampling resistor 4, compares the current flowing through the sampling resistor 4 with the current threshold to obtain the comparison result, and controls the power supply driver 2 to generate the driving voltage lowered to the preset value lower than the voltage threshold if the comparison result is that the current is greater than or equal to the current threshold.

With such arrangement, the voltage (or current) detection function, the function of the comparison between the voltage and the voltage threshold (or a function of a comparison between the current and the current threshold), and the function of responding and controlling the power supply driver 2 after the comparison may be all integrated in the logic controller 53, which is beneficial to further simplify the overall structure of the display module 100.

In some embodiments, referring to FIG. 10, the display module 100 further includes the analog-to-digital converter 54.

Referring to FIG. 18, before S401, the method further includes S400.

In S400, the analog-to-digital converter 54 obtains the potentials at the two ends of the sampling resistor 4, converts the potentials at the two ends of the sampling resistor 4 from the analog potential signals into the digital potential signals, and then outputs the digital potential signals to the logic controller 53.

With such arrangement, it is helpful for the subsequent logic controller 53 to calculate the voltage across the sampling resistor 4 or the current flowing through the sampling resistor 4 more quickly, thereby increasing the speed of feedback control of the power supply driver 2 and improving safety.

In some embodiments of the present disclosure, a method for driving another display module is provided. Referring to FIG. 11, the display module 200 includes the display panel 1, the power supply driver 2, the voltage signal line 3, the sampling resistor 4 and the detection and output circuit 9.

Referring to FIG. 19, the method includes S501.

In S501, the detection and output circuit 9 detects and outputs the voltage across the sampling resistor 4 or the current flowing through the sampling resistor 4.

With such arrangement, the current change in the voltage signal line 3 may be monitored. When the current in the voltage signal line 3 is too large to cause damage to the display panel 1, the voltage across the sampling resistor 4 or the current flowing through the sampling resistor 4 at this time may be output. In this case, the voltage across the sampling resistor 4 or the current flowing through the sampling resistor 4 may be served as an important reference for setting the voltage threshold and the current threshold. For example, the output value may be directly served as the voltage threshold or the current threshold. For another example, a value slightly lower than the output value may be served as the voltage threshold or the current threshold.

For example, referring to FIG. 12, the detection and output circuit 9 includes the subtractor circuit 51 and the analog-to-digital converter 54.

Figure 20:
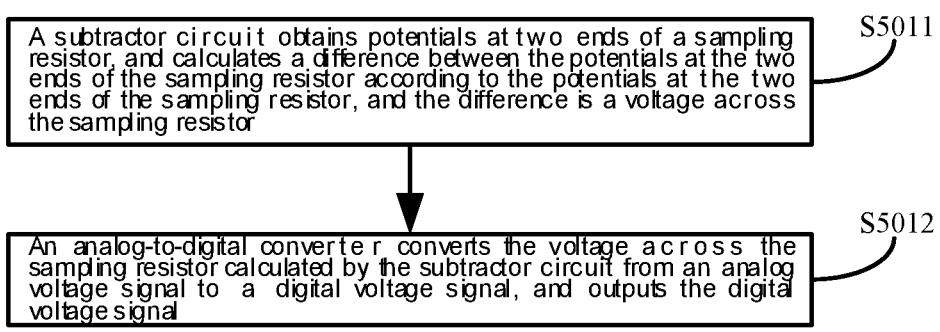
FIG. 20 is a flow diagram of yet another method for driving a display module, in accordance with some embodiments.

Referring to FIG. 20, S501 includes S5011 and S5012, and the method includes the following steps.

In S5011, the subtractor circuit 51 obtains the potentials at the two ends of the sampling resistor 4, and calculates the difference between the potentials at the two ends of the sampling resistor 4 according to the potentials at the two ends of the sampling resistor 4. The difference is the voltage across the sampling resistor 4.

In S5012, the analog-to-digital converter 54 converts the voltage across the sampling resistor 4 calculated by the subtractor circuit 51 from the analog voltage signal into the digital voltage signal, and outputs the digital voltage signal.

With such arrangement, the digital voltage signal may facilitate the reading of the real-time voltage across the sampling resistor 4 by the tester, thereby facilitating the setting of the voltage threshold or the current threshold.

The foregoing descriptions are merely specific implementations of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display module, comprising:
    a display panel;
    a power supply driver configured to generate a driving voltage;
    a chip-on-film circuit board, the chip-on-film circuit board including: a substrate, and a first connection electrode and a second connection electrode that are located on the substrate, the first connection electrode being connected to the display panel;
    a voltage signal line connected between the display panel and the power supply driver, and configured to transmit the driving voltage generated by the power supply driver to the display panel, so that the display panel emits light, wherein the voltage signal line includes: a first conductive portion located on the substrate and connected between the first connection electrode and the second connection electrode; and a second conductive portion connected between the second connection electrode and the power supply driver;
    a sampling resistor connected in series with the voltage signal line, wherein the sampling resistor is connected with the second conductive portion, and the resistance of the sampling resistor is within a range of 1 mΩ to 2 mΩ;
    a detection and control circuit connected to two ends of the sampling resistor, and configured to detect a voltage across the sampling resistor;
    a main control circuit board, wherein the power supply driver and the detection and control circuit are located on the main control circuit board; and
    a flexible circuit board connected between the main control circuit board and the second connection electrode, wherein the second conductive portion and the sampling resistor are located on the flexible circuit board, wherein
    the detection and control circuit is further connected to the power supply driver, and is further configured to perform controlling the power supply driver to generate a driving voltage equal to a preset value lower than a voltage threshold in a case where the detection and control circuit determines that the voltage across the sampling resistor is greater than or equal to the voltage threshold, wherein the voltage threshold is within a range of 1 mV to 2 mV; and
    the detection and control circuit includes:
        a subtractor circuit connected to the two ends of the sampling resistor, and configured to obtain potentials at the two ends of the sampling resistor, and calculate a difference between the potentials at the two ends of the sampling resistor according to the potentials at the two ends of the sampling resistor, wherein the difference is the voltage across the sampling resistor;
        a comparator circuit connected to the subtractor circuit, and configured to obtain the voltage across the sampling resistor calculated by the subtractor circuit, and compare the voltage across the sampling resistor with the voltage threshold to obtain a comparison result; and
        a logic controller connected to the comparator circuit and the power supply driver, and configured to obtain the comparison result of the comparator circuit, and control the power supply driver to generate the driving voltage equal to the preset value lower than the voltage threshold in a case where the comparison result is that the voltage across the sampling resistor is greater than or equal to the voltage threshold.

2. The display module according to claim 1, wherein the preset value is equal to 0 V.

3. The display module according to claim 1, further comprising:
    a polarizer disposed on a display side of the display panel.

4. A display apparatus, comprising:
    the display module according to claim 1.

5. A method for driving the display module according to claim 1,
    the method comprising:
    detecting, by the detection and control circuit, the voltage across the sampling resistor; and performing, by the detection and control circuit, controlling the power supply driver to generate a driving voltage equal to the preset value lower than the voltage threshold in a case where the detection and control circuit determines that the voltage across the sampling resistor is greater than or equal to the voltage threshold;

wherein the detection and control circuit includes a subtractor circuit, a comparator circuit and a logic controller, the subtractor circuit is connected to the two ends of the sampling resistor, the comparator circuit is connected to the subtractor circuit, the logic controller is connected to the comparator circuit, and the logic controller is further connected to the power supply driver;

the method comprises:

obtaining, by the subtractor circuit, potentials at the two ends of the sampling resistor, and calculating, by the subtractor circuit, a difference between the potentials at the two ends of the sampling resistor according to the potentials at the two ends of the sampling resistor, wherein the difference is the voltage across the sampling resistor;

obtaining, by the comparator circuit, the voltage across the sampling resistor calculated by the subtractor circuit, and comparing, by the comparator circuit, the voltage across the sampling resistor with the voltage threshold to obtain a comparison result; and obtaining, by the logic controller, the comparison result of the comparator circuit, and controlling, by the logic controller, the power supply driver to generate the driving voltage equal to the preset value lower than the voltage threshold in a case where the comparison result is that the voltage across the sampling resistor is greater than or equal to the voltage threshold.

\* \* \* \* \*